United States Patent [19]

Tsuge et al.

[11] Patent Number: 4,956,023

[45] Date of Patent: Sep. 11, 1990

[54] INTEGRATED SOLAR CELL DEVICE

[75] Inventors: Kazunori Tsuge; Toshihito Endo; Kenji Kobayashi; Yoshihisa Tawada, all of Kobe, Japan

[73] Assignee: Kanegafuchi Kagaku Kogyo Kabushiki Kaisha, Osaka, Japan

[21] Appl. No.: 286,180

[22] PCT Filed: Mar. 30, 1988

[86] PCT No.: PCT/JP88/00319

§ 371 Date: Jan. 27, 1989

§ 102(e) Date: Jan. 27, 1989

[87] PCT Pub. No.: WO88/07768

PCT Pub. Date: Oct. 6, 1988

[30] Foreign Application Priority Data

Mar. 31, 1987 [JP] Japan ................................. 62-80363

[51] Int. Cl.$^5$ .............................................. H01L 31/05
[52] U.S. Cl. .................................... 136/244; 136/258
[58] Field of Search ............ 136/244, 258 AM; 437/2, 437/4, 189, 200, 205

[56] References Cited

U.S. PATENT DOCUMENTS

| | | | |
|---|---|---|---|
| 4,532,371 | 7/1985 | Hanak et al. | 136/249 |
| 4,623,751 | 11/1986 | Kishi et al. | 136/244 |
| 4,675,466 | 6/1987 | Ramaprasad | 136/244 |

FOREIGN PATENT DOCUMENTS

| | | | |
|---|---|---|---|
| 55-134989 | 10/1980 | Japan . | |
| 58-78473 | 5/1983 | Japan . | |
| 58-101468 | 6/1983 | Japan . | |
| 59-29475 | 2/1984 | Japan . | |
| 59-220978 | 12/1984 | Japan | 136/244 |
| 60-31258 | 2/1985 | Japan . | |
| 60-43869 | 3/1985 | Japan . | |
| 61-164274 | 7/1986 | Japan | 136/244 |
| 62-61376 | 3/1987 | Japan | 136/244 |

*Primary Examiner*—Aaron Weisstuch
*Attorney, Agent, or Firm*—Armstrong, Nikaido, Marmelstein, Kubovcik & Murray

[57] ABSTRACT

An integrated solar cell device characterized in that a plurality of amorphous silicon solar cells, each having a transparent electrode on the light impinging side and a metal electrode on the side opposite of the light impinging side, are placed on a transparent substrate. The plurality of solar cells are connected in series or series-parallel using the transparent electrodes and the metal electrodes thereof, wherein at least a conductive anti-oxidation film is formed at the series connection part between the transparent electrode and the metal electrode. According to the integrated solar cell device of the present invention, the transparent electrode is prevented from oxidizing the metal electrode, so that the contact resistance is prevented from increasing and the output of the solar cell device can be prevented from decreasing. Consequently, the life of the solar cell device is extended, such that the output of the solar cell device can be maintained in the designed range for a long period.

14 Claims, 4 Drawing Sheets

INTEGRATED SOLAR CELL DEVICE

BACKGROUND OF THE INVENTION

The present invention relates to an integrated solar cell device wherein many small size solar cells formed on a transparent substrate are connected in series or series-parallel therewith, and to a manufacturing method thereof.

Until now integrated solar cell devices, wherein many small size solar cells formed on a transparent substrate are connected in series or series-parallel are made by laminating a transparent electrode comprising indium-tin oxide (hereinafter referred to as ITO), tin oxide (hereinafter referred to as $SnO_2$) or the like on the surface of a light impinging side laminated with a metal electrode comprising aluminum, copper or the like on the opposite solar cell surface; and by constituting series connections between the transparent electrode of a solar cell and the metal electrode of another solar cell.

In the above mentioned solar cell device, the transparent electrode comprising ITO, $SnO_2$ or the like is an oxide, such that the component parts of the transparent electrode can oxidize the metal electrode via a part to which the transparent electrode is contacted the cell if left over for a long time period. As a result, the contact resistance of the part increases.

Thus, there is a problem that the output of the solar cell device decreases when the resistance of the series connected parts thereof increases.

Further, there is a problem that the output characteristic is lowered due to oxidation of the metal layer to which the transparent electrode is connected making an electrical connection when the solar cell device made by the above-mentioned method is used under high temperature. Particularly, when a metal which is liable to be oxidized is employed, the output characteristic of a solar cell device is considerably lowered.

SUMMARY OF THE INVENTION

An integrated solar cell device of the present invention has an anti-oxidation film formed at the series connection points of the transparent electrodes laminated on the light impinging side of a solar cell, and a metal electrode on the opposite side of a solar cell so that the transparent electrode is prevented from oxidizing the metal electrode even if the solar cell device is used at high temperatures. As a result, the contact resistance is prevented from increasing and the output of the solar cell device can be prevented from decreasing. Consequently, the life of solar cell device is extended, so that the output of the solar cell device can be maintained in the designed range for a long period.

The above-mentioned drawbacks being taken into consideration, an integrated solar cell device of the present invention comprises a plurality of solar cells of which a light impinging surface having a transparent electrode and the opposite surface having a metal electrode are arranged on a transparent substrate, wherein the solar cells are connected in series or series-parallel by suitably connecting the transparent electrodes and the metal electrodes. This is characterized in that anti-oxidation films having electric conductivity are provided at least at the places where the transparent electrodes and the metal electrode are connected.

In the integrated solar cell device of the present invention having the above-mentioned construction, the present invention is intended to prevent the output of the solar cell device from decreasing by providing the anti-oxidation films between the metal electrodes and the transparent electrodes.

The anti-oxidation films may be made separately as is mentioned above, or may be made by varying the metal component ratio in the transparent electrodes.

Specifically, the anti-oxidation films are made by means whereby the metal component of the transparent electrodes at least in the neighborhood of metal electrodes is increased as compared with other regions. It is made by increasing the metal component of the subsurface layer of the transparent electrodes via a reduction of the metal oxide, or by increasing the metal component of the subsurface layer of the transparent electrodes which is opposite to the transparent substrate so that the metal component ratio in that region becomes larger than those of other regions.

In the present specification, the region in which the metal component ratio of the transparent electrode is varied is included in the concept of the anti-oxidation film.

In this case, it is preferable that the metal component ratio in the subsurface layer is typically increased by at least 1.2 times as much as the ratio of other regions. Further, it is necessary that the thickness of the subsurface layer where the metal component ratio is increased by reduction be more than 10 Å, preferably 20 Å to 30 Å. On the other hand, when the metal component ratio is 90 atomic % or more, it is preferable that the thickness of that layer be equal to or less than 150 Å.

Normal transparent substrates which are employed in manufacturing semiconductors, such as glass and heat-resistant high polymer films, are enumerated as examples of the substrate employed in the present invention.

On the above-mentioned substrate, the transparent electrode, which is electrically isolated is laminated. ITO, $SnO_2$ and ZnO are enumerated as specific examples of the transparent electrode.

On the transparent electrode, which is formed on the transparent substrate in electrically isolated segments by patterning, an amorphous silicon semiconductor layer is laminated.

In the present invention, an amorphous silicon semiconductor represents either a semiconductor comprising only amorphous silicon or amorphous silicon containing crystallites. a-Si:H, a-SiC:H, a-SiN:H, a-SiGe, a-SiSn, $\mu$ C-SI:H (microcrystalline) and the like are enumerated as specific examples of amorphous silicon semiconductors.

The anti-oxidation film of the solar cell device in present invention is formed by raising the metal component ratio of the subsurface layer of the transparent electrode which is exposed to contact with the metal electrode by removing the over layer amorphous silicon semiconductor layer. Raising the metal component ratio can be realized by applying reducing gas or liquid to the exposed layer of the transparent electrode. Alternatively, it may be realized by depositing metal oxide whose metal component ratio is raised beforehand. Further, in the case of making the metal component ratio especially high, it is necessary to adjust the thickness of the anti-oxidation film in order not to extremely damage the transparency of the transparent electrode. The metal component ratio can be easily measured by a conventional analysis method, for example, AES.

As a method for removing parts of the amorphous silicon semiconductor layer, an energy beam method, an etching method or a lift-off method can be adopted.

Al, Cu, Cr and the like are enumerated as examples of back metal electrode materials. By dividing the back metal electrode into segments a solar cell device wherein a plurality of solar cells are connected in series can be obtained.

As methods for dividing the back metal electrode, an etching method, an energy beam method or a lift-off method can be utilized.

BEST MODE FOR CARRYING OUT THE INVENTION

Referring now to the accompanying drawings, there is explained embodiments of the present invention by way of examples.

Figure 1:
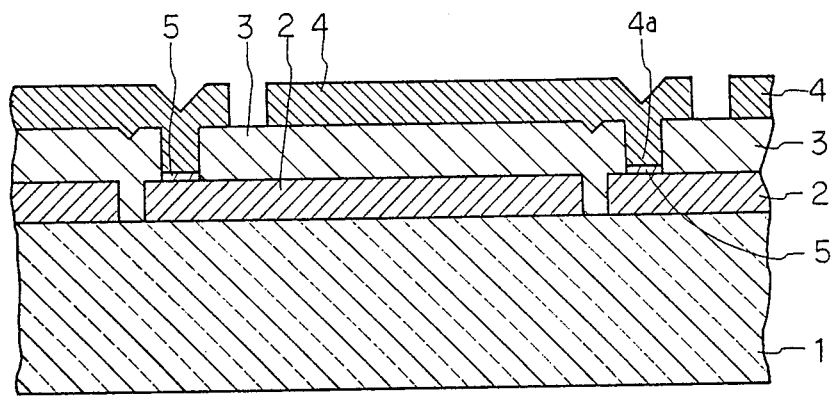
FIG. 1 shows a sectional view of a first example of an integrated solar cell device of the present invention.

FIG. 1 shows a sectional view of the first example of an integrated solar cell device of the present invention.

In the drawing, numeral 1 is a glass substrate which is placed on a light impinging side of the solar cell device.

Numeral 2 is a transparent electrode comprising a transparent conductive film such as ITO, $SnO_2$ or ZnO, which is patterned by etching or by a laser beam in order for the electrode to be divided to form small size solar cells.

Numeral 3 is an amorphous semiconductor layer which is laminated by a glow discharge decomposition method. The layer 3 is patterned by a laser beam etc. similar to the transparent electrode 2.

An electrode 4 made of metal such as aluminum is formed on the amorphous semiconductor layer by an electron beam deposition method as a back electrode, and then the electrode 4 is patterned by a chemical etching method and the like.

The integrated solar cell device shown in FIGS. 1 to 4 is a series-connected type wherein solar cells placed side by side are connected to one another. However, a combination of series-connections and parallel-connections may be adopted by suitably selecting the pattern.

In a solar cell device of the present invention, a metal film or a metal silicide film is formed with a metal mask on the transparent layer 2, exposed by a laser beam and the like, by means of electron, beam deposition as an anti-oxidation film before the metal electrode 4 is formed.

Metals selected among Mo, Ni, Cr, W, Pd, Pt, Mn, Fe and the like, are used for the anti-oxidation film, and the thickness of the film is in the range of 10 to 200 Å.

Figure 2:
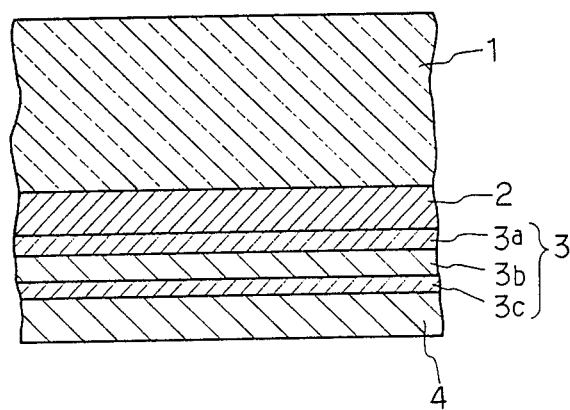
FIG. 2 shows an explanatory sectional view of an amorphous silicon solar cell device of the integrated solar cell device of the present invention.

Every kind of solar cell device can be applied to the present invention. In the present embodiment, as shown in FIG. 2, a PIN-type solar cell device is employed wherein p-type amorphous silicon carbide 3a, i-type amorphous silicon 3b, and n-type amorphous silicon 3b layers are laminated in this order from the light impinging side.

The first embodiment of the integrated solar cell device of the present invention has the above-mentioned structure, i.e. an anti-oxidation film 5 comprising metal or metal silicide is formed between a transparent electrode 2 and a metal electrode 4 of a solar cell device 3 having series connection, such that the metal electrode 4 comprising aluminum or the like is prevented from being oxidized by the transparent electrode 2 made of a conductive transparent layer comprising ITO, $SnO_2$ or ZnO via the connecting part 4a. As a result, there can be realized a solar cell device which maintains its initial output for a long time without decreasing its characteristics.

And also, since amorphous silicon solar cells are used, the cost of the solar cell device can be lowered. Particularly, amorphous silicon carbide is used for the p-type layer, which is laminated on the light impinging side, so that the energy conversion efficiency can be improved.

Figure 3:
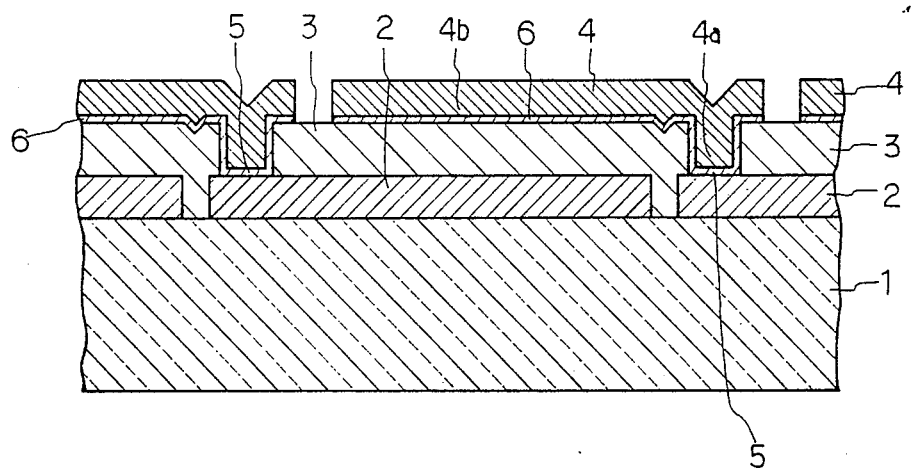
FIG. 3 shows a sectional view of a second example of the integrated solar cell device of the present invention.

FIG. 3 is a sectional view of a second embodiment of the integrated solar cell device of the present invention.

In the second embodiment, in the same manner as the first embodiment, a transparent electrode 2 and an amorphous semiconductor layer 3 are laminated on the glass substrate 1 in this order, and then a part of the transparent electrode 2 is exposed by a laser beam method or the like.

Then, the anti-oxidation film 5 is formed by depositing a film of metal such as Mo, Ni, Cr, W, Pd, Pt, Mn, Fe and the like, or a film of a silicide of metal such as Mo, Ni, Cr, W, Pd, Pt, Mn, Fe and the like on the whole surface opposite the light impinging surface.

Further, a metal electrode 4 made of metal such as aluminum is formed, and then the electrode 4 and the anti-oxidation film 5 are patterned by a chemical etching method or the like.

The anti-oxidation film 5 prevents the transparent electrode 2 from oxidizing the metal electrode 4 at the connection 4a of the transparent electrode 2 and the metal electrode 4. The film acts as a metal diffusion-blocking film 6 at the interface 4b of the semiconductor layer 3 with the metal electrode 4.

Since the present solar cell comprises a type of amorphous semiconductor, the metal component of the metal electrode 4 thermally into the n-type amorphous silicon layer 3c and decreases the efficiency of the solar cell device. However, by laminating the metal of diffusion-blocking film 6, the metal component of the metal electrode 4 can be prevented from diffusing into the semiconductor layer even if the temperature of the solar cell device is raised.

Particularly, when a layer that has Mo, Ni, Cr or the like are selected as the metal component is laminated, the metal diffusion can be efficiently prevented.

The second embodiment of the integrated solar cell device has the above-mentioned construction, like the first embodiment, wherein the transparent electrode 2 and the metal electrode 4 are connected in series via the anti-oxidation film 5, so that the transparent electrode 2 is prevented from oxidizing the metal component of the metal electrode 4, and the output of the solar cell device is prevented from decreasing. Also, masks are not used when the anti-oxidation film 5 is formed, and thus the manufacturing process is simplified.

Further, the metal components of the metal electrode 4 are prevented from thermally diffusing into the semiconductor layer 3 by means of the metal diffusion-blocking film 6, so that degradation by heat is prevented. This results in a solar cell device having long-life.

Figure 4:
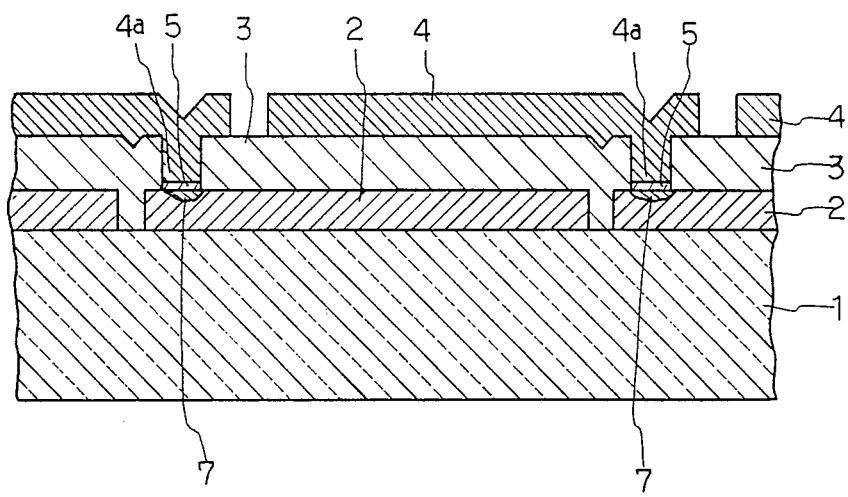
FIG. 4 shows a sectional view of a third example of the integrated solar cell device of the present invention.

FIG. 4 is a cross-sectional view of a third embodiment of the integrated solar cell device of the present invention.

In the third embodiment, a transparent electrode 2 and a semiconductor layer 3 are laminated on a glass substrate 1 in the same manners as those of the first embodiment, and then part of the transparent electrode 2 is exposed by the laser scribing and the like.

A reduced layer 7 is then formed by reducing the exposed parts of the transparent electrode 2 with hydrogen generated by a glow discharge device. The anti-oxidation film 5 and a metal electrode 4 are laminated as in the first embodiment.

In the third embodiment, a metal film of Mo, Ni, Cr, W, Pd, Pt, Mn, Fe or the like, or a metal silicide layer comprising Mo, Ni, Cr, W, Pd, Pt, Mn, Fe, and the like are used, as in the first embodiment, as the anti-oxidation film 5 sandwiched between the reduced layer 7 and the metal electrode 4.

Alternatively, as a simplified method, the reduced layer 7 may be directly contacted with the metal electrode 4 without forming the metal film or the metal silicide layer between the reduced layer 7 and the metal electrode 4.

The third embodiment of the integrated solar cell device of the present invention is constructed as is mentioned above, wherein the transparent electrode 2 is reduced at the contact part 4a between the transparent electrode 2 and the metal electrode 4 in order to increase the metal component ratio and to form the reduced layer 7 and the oxidation-proof layer 5 which acts as an anti-oxidation film. The anti-oxidation film increases the effect of oxidation-resistance so that a decrease in the output of the solar cell device can be prevented.

Next, the actual characteristics of the integrated solar cell device of the present invention are described.

EXAMPLE 1

On a blue glass plate of 1.1 mm thickness, a transparent electrode of $SnO_2$ of 9000 Å thickness was laminated, and the transparent electrode was patterned by a laser beam.

Then, a silicon semiconductor layer comprising a p-type amorphous carbide layer of 150 Å thickness, an i-type amorphous silicon of 6000 Å and an n-type crystallite silicon of 300 Å by glow discharge decomposition is formed onto the transparent electrode on the glass substrate by glow discharge decomposition at a temperature of 200° C. and a pressure of 1.0 Torr.

Further, some parts of the transparent electrode were exposed by removing the over-layed semiconductor layer with a laser beam, and an anti-oxidation film of Mo of 60 Å thickness was laminated onto the exposed parts of the transparent electrode by electron beam deposition. An Al layer of 5000 Å thickness was laminated onto it, and then individual metal electrodes were formed by patterning the Al layer by chemical etching.

The initial characteristics, characteristics after 200 hour heating at a temperature of 80° C., and characteristics after three months at room temperature of the obtained solar cell device were measured by an AM-1 solar-simulator of 100 mW/cm². The results are shown in Table 1.

EXAMPLE 2

A solar cell device was made in the same manner as that of Example 1 except that a chromium silicide layer was laminated by electron beam deposition with a target of chromium silicide instead of a Mo metal film as the anti-oxidation film.

The thickness of the chromium silicide layer was in the range of 40 to 50 Å.

The characteristics of the obtained solar cell device were measured in the same manner as those of Example 1. The results are shown in Table 1.

EXAMPLE 3

After some parts of a transparent electrode were exposed, the surfaces of the exposed parts of the transparent electrode were reduced by generating hydrogen plasmas with a glow discharge device. Then, a Mo layer of 60 Å thickness was laminated as an anti-oxidation film in the same manner as in Example 1, and an Al metal electrode was laminated in the same manner as in Example 1.

The characteristics of the obtained solar cell device are shown in Table 1.

COMPARATIVE EXAMPLE 1

A solar cell device was made in the same manner as in Example 1 except that an anti-oxidation film of Mo film was not provided. The characteristics of the obtained solar cell device were measured. The results are shown in Table 1.

From Table 1, it is clearly understandable that, in the solar cell devices of Example 1, Example 2 and Example 3 of the present invention, the values of short circuit current density (Jsc) of the current density-voltage characteristics of the solar cell devices, the values of FF (fill-factor) of the curve factor, and the values of energy converting efficiency ($\eta$) are nearly constant even after they were heated at a temperature of 80° C. for 200 hours, or even after they were left alone at room temperature for 3 months, and that a decrease in the efficiency of the solar cell device is prevented without the transparent electrode oxidizing the components of the metal electrodes due to heating or after leaving the device alone at room temperature.

TABLE 1

|  | Initial characteristics | | | | Characteristics after 200 hours heating | | | | Characteristics after 3 months at room temperature | | | |
| --- | --- | --- | --- | --- | --- | --- | --- | --- | --- | --- | --- | --- |
|  | Jsc (mA/cm²) | Voc (V) | FF (%) | h (%) | Jsc (mA/cm²) | Voc (V) | FF (%) | h (%) | Jsc (mA/cm²) | Voc (V) | FF (%) | h (%) |
| Example 1 | 16.4 | 14.2 | 68.2 | 9.93 | 16.2 | 14.2 | 68.0 | 9.78 | 16.3 | 14.2 | 68.5 | 9.91 |
| Example 2 | 15.6 | 14.2 | 68.4 | 9.47 | 15.5 | 14.2 | 68.1 | 9.37 | 15.6 | 14.1 | 68.3 | 9.39 |
| Example 3 | 16.5 | 14.2 | 69.0 | 10.1 | 16.3 | 14.2 | 69.1 | 10.0 | 16.6 | 14.2 | 68.9 | 10.2 |
| Comparative Example 1 | 16.6 | 14.2 | 66.0 | 9.72 | 14.8 | 13.9 | 53.5 | 6.88 | 15.5 | 14.0 | 56.2 | 7.62 |

Next, there is described an embodiment wherein a transparent electrode is directly contacted with a metal electrode 4 without laminating a metal film or a metal silicide layer. Hereinafter there is described an embodiment wherein the surface of the transparent electrode is reduced with hydrogen plasma. FIGS. 5 to 11 are schematic illustrations of the manufacturing method of the integrated solar cell device of the present invention.

Figure 5:
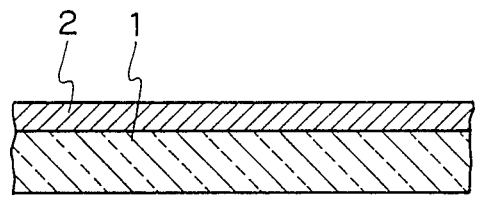
FIGS. 5 to 11 illustrate an embodiment of a manufacturing method of the present invention.
Figure 6:
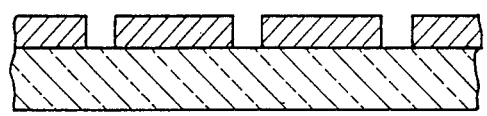
Figure 7:
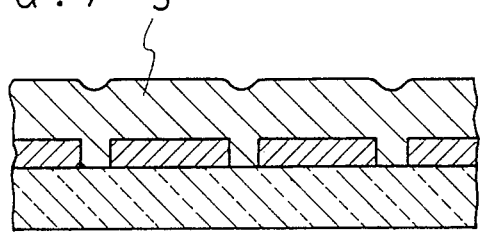

At first, as shown in FIG. 5, a transparent electrode 2 of $SnO_2$ or the like is laminated on a transparent substrate 1 such as a glass plate by a CVD method or the like. Next, as shown in FIG. 6, the electrode is patterned by a laser beam. Then, an amorphous silicon semiconductor layer is laminated onto it by a glow discharge decomposition method or the like (refer to FIG. 7).

Figure 8:
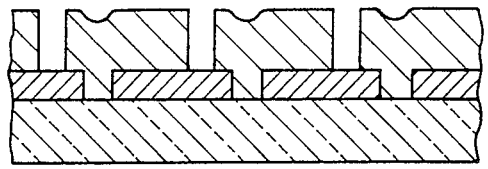
Figure 9:
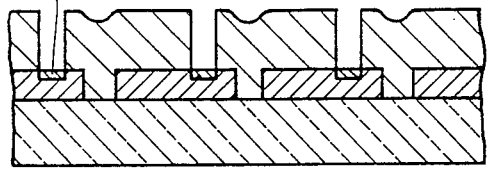

After that, as shown in FIG. 8, some parts of the amorphous silicon semiconductor layer 3 are removed by a laser beam, and the under lying transparent electrode 2 is thus partially exposed. Then, as shown in FIG. 9, a reduced layer 7 is formed by reducing the exposed transparent electrode with hydrogen plasma generated by a vacuum device such as a sputtering device.

As to the conditions of the hydrogen plasma generation a hydrogen quantity of 30 to 300 sccm, a chamber pressure of 0.3 to 3 Torr, a substrate temperature of 180° C. to laminating temperature, and a discharging period of 1 to 10 min. are used.

Figure 10:
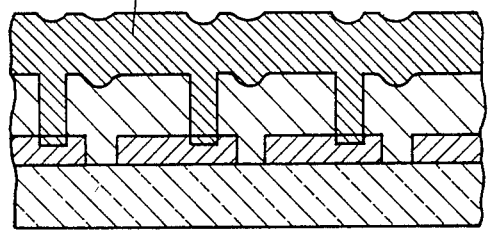
Figure 11:
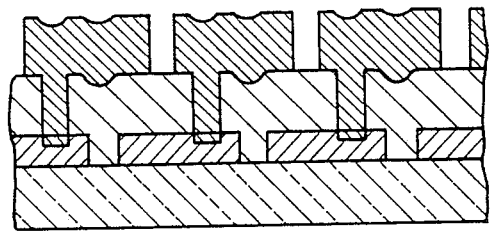

After the hydrogen treatment, as shown in FIG. 10, a back electrode 4 is laminated. As shown in FIG. 11, a solar cell device of the present invention can be manufactured with the back electrode 4 being patterned.

Next, the present embodiment based on a specific example is explained.

EXAMPLE 4

A transparent electrode of $SnO_2$ of 4500 Å thickness was laminated on a blue glass plate of 1.1 mm thickness, and then the transparent electrode was patterned by a laser beam. After that, by glow discharge decomposition, an amorphous silicon semiconductor layer comprising a p-type amorphous silicon layer of SiC:H and 150 Å thickness, an i-type amorphous silicon layer of Si:H 6000 Å thick, and an n-type crystallite layer or Si:H 300 Å thick, was formed at the temperature of 200° C. at the substrate, under a pressure of about 1.0 Torr. Some parts of the transparent electrode were then exposed by removing the over layed semiconductor layer.

Then, the surface of the exposed transparent electrode was reduced by generating hydrogen plasma with a sputtering device. As a result, most of the exposed surface of the transparent electrode was reduced into metallic Sn. An Al electrode was laminated by sputtering to the thickness of 5000 Å. After that, a solar cell device, wherein 16 solar cells were connected in series on a plane, was manufactured by patterning the Al electrode by chemical etching. The effective area of each solar cell was about 8.75 cm$^2$, and the total effective area was about 140 cm$^2$.

The listed characteristics on Table 2 of the obtained solar cell device having 16 solar cells connected in series were measured at initially and after a 10 hour heating at a temperature of 150° C., with an AM-1-solar simulator of 100 mW/cm$^2$ The results are shown in Table 2.

EXAMPLE 5

A solar cell device was manufactured in the same manner as in Example 3 except that a transparent electrode was reduced with an hypo-phosphite solution instead of hydrogen plasma, and then the characteristics of the obtained solar cell device were measured. The results are shown in Table 1.

EXAMPLE 6

A substrate with a transparent electrode was formed, wherein a normal $SnO_2$ layer of 4500 Å thickness was laminated on a blue glass plate and a $SnO_2$ layer of 100 Å thickness having a Sn component 20 atomic % more than that of the normal $SnO_2$ layer was laminated on the normal $SnO_2$ layer. After that, the transparent electrode was patterned in the same manner as in Example 4 and a semiconductor layer was laminated onto the transparent electrode. Afterwards, parts of the transparent electrode were exposed by removing portions of the over layed semiconductor layer.

An Al electrode was then laminated by sputtering, and a solar cell device wherein 16 solar cells were connected in series on a plane was manufactured by patterning the Al electrode by chemical etching. The same parameters as those of Example 4 were measured for the obtained solar cell device. The results are shown in Table 2.

COMPARATIVE EXAMPLE 2

A solar cell device was manufactured in the same manner as in Example 4 except that the transparent electrode was not reduced with hydrogen plasma, and the same parameters as those of Example 4 were measured for the obtained solar cell device. The results are shown in Table 2.

Although specific forms of embodiment of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

TABLE 2

|  | Initial characteristics of solar cell device | | | | Characteristics of solar cell device after 10 hour heating | | | |
| --- | --- | --- | --- | --- | --- | --- | --- | --- |
|  | Jsc (mA/cm$^2$) | Voc (V) | FF (%) | h (%) | Jsc (mA/cm$^2$) | Voc (V) | FF (%) | h (%) |
| Example 4 | 16.4 | 14.2 | 65.3 | 9.50 | 16.2 | 14.2 | 65.1 | 9.36 |
| Example 5 | 16.4 | 14.2 | 65.3 | 9.50 | 16.2 | 14.2 | 65.1 | 9.36 |
| Example 6 | 15.8 | 14.2 | 65.3 | 9.16 | 15.4 | 14.2 | 64.8 | 8.86 |
| Comparative Example 2 | 16.6 | 14.2 | 66.0 | 9.72 | 12.2 | 13.7 | 42.3 | 4.42 |

We claim:

1. An integrated solar cell device characterized in that a plurality of amorphous silicon solar cells, each having a transparent electrode on the light impinging side, an amorphous silicon layer, and a metal electrode on the side opposite the light impinging side, are placed on a transparent substrate, and the plurality of solar cells are connected in series or series-parallel using the transparent electrode and the metal electrode thereof, wherein a conductive anti-oxidation film made from a metal silicide is formed between the transparent electrode and the metal electrode at the series connection, and between the amorphous silicon layer and the metal electrode.

2. An integrated solar cell device according to claim 1, wherein the amorphous silicon solar cell is of PIN-type.

3. An integrated solar cell device according to claim 1 or claim 2, wherein the solar cell comprises a layer of amorphous silicon carbide on the light impinging side.

4. An integrated solar cell device according to claim 1, wherein the transparent electrode comprises ITO, $SnO_2$ or ZnO.

5. An integrated solar cell device according to claim 2 wherein the thickness of said anti-oxidation film is in the range of 10 to 200 Å.

6. An integrated solar cell device according to claim 1 or claim 2, wherein said anti-oxidation film extends between said amorphous silicon layer and the metal electrode thereby forming a metal diffusion-blocking layer.

7. An integrated solar cell device according to claim 1 or claim 2, wherein the transparent substrate is a glass substrate.

8. An integrated solar cell device comprising:
a transparent substrate; and
a plurality of interconnected amorphous silicon solar cells formed on said substrate, each said solar cell having an amorphous silicon layer with a light impinging side and a side opposite the light impinging side, each said solar cell having a transparent electrode formed on the light impinging side, a metal electrode on the opposite side, and a conductive metal silicide anti-oxidation film formed between the transparent electrode and the metal electrode at the connection between said cell and between the amorphous silicon layer and the metal electrode, said solar cells being connected on said substrate in series or in series-parallel via the transparent and metal electrodes.

9. An integrated solar cell device according to claim 8, wherein the amorphous silicon solar cell is of PIN-type.

10. An integrated solar cell device according to claim 8 or claim 9, wherein the solar cell further comprises amorphous silicon carbide on the light impinging side.

11. An integrated solar cell device according to claim 8, wherein the transparent electrode comprises ITO, $SnO_2$ or ZnO.

12. An integrated solar cell device according to claim 9, wherein the thickness of the anti-oxidation film is in the range of 10 to 200 Å.

13. An integrated solar cell device according to claim 8 or claim 9, wherein the anti-oxidation film extends between said amorphous silicon layer and the metal electrode thereby forming a metal diffusion-blocking layer.

14. An integrated solar cell device according to claim 8 or claim 9, wherein said transparent substrate is a glass substrate.

* * * * *

UNITED STATES PATENT AND TRADEMARK OFFICE
CERTIFICATE OF CORRECTION

PATENT NO. : 4,956,023
DATED : September 11, 1990
INVENTOR(S) : Kazunori TSUGE et al It is certified that error appears in the above-identified patent and that said Letters Patent is hereby corrected as shown below:

Column 2, line 48, delete "crystallites." and insert therefor --crystallites,--;
  line 49, delete "SI" and insert therefor --Si--.
Column 3, line 15, delete "invention:" and insert therefor --invention;--.
Column 5, line 48, after "amorphous" insert --silicon--;
  line 49, after "silicon" insert --layer--; after "Å" insert --thickness--;
  line 50, after "silicon" insert --layer--; after "Å" insert --thickness--.
Column 7, line 43, after "silicon" insert --carbide--;
  line 45, before "6000" insert --and--; delete "or" and insert therefor --of--; delete "thick" and insert therefor --thickness--; delete "crystallite" and insert therefor --microcrystalline--;
  line 46, before "300" insert --and--; delete "thick" and insert therefor --thickness--.
Column 8, line 17, delete "1" and insert therefor --2--.

Signed and Sealed this

Eighth Day of December, 1992

*Attest:*

DOUGLAS B. COMER

*Attesting Officer*   Acting Commissioner of Patents and Trademarks